United States Patent
Dean et al.

(10) Patent No.: US 6,564,900 B1
(45) Date of Patent: May 20, 2003

(54) METHOD AND APPARATUS FOR REDUCING ACOUSTIC NOISE IN MRI SCANNERS

(75) Inventors: David Dean, Hartland, WI (US); Robert Vavrek, Waukesha, WI (US); Scott Mansell, Waterford, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 69 days.

(21) Appl. No.: 09/721,378

(22) Filed: Nov. 22, 2000

(51) Int. Cl.[7] .................................................. H02K 5/24
(52) U.S. Cl. ........................ 181/202; 324/200; 381/71.2
(58) Field of Search .................................. 181/200, 202, 181/205, 206, 207, 209; 324/300, 307, 309, 314, 318; 381/71.2, 71.3, 71.7

(56) References Cited

U.S. PATENT DOCUMENTS

| | | | |
|---|---|---|---|
| 4,774,486 A | | 9/1988 | Moritsu ........................ 335/299 |
| 5,051,700 A | * | 9/1991 | Fox ............................. 324/322 |
| 5,189,372 A | * | 2/1993 | Igarashi et al. ............. 324/318 |
| 5,345,177 A | | 9/1994 | Sato et al. ................... 324/318 |
| 5,530,355 A | * | 6/1996 | Doty ........................... 324/318 |
| 5,548,653 A | * | 8/1996 | Pla et al. ................. 381/71.11 |
| 5,617,026 A | * | 4/1997 | Yoshino et al. ............. 324/318 |
| 5,877,732 A | * | 3/1999 | Ziarati ............................ 345/8 |
| 6,431,310 B1 | * | 8/2002 | Heitmann .................... 181/200 |

FOREIGN PATENT DOCUMENTS

EP          0 981 057 A2     2/2000      ....... G01R/33/3815

* cited by examiner

*Primary Examiner*—Kim Lockett
(74) *Attorney, Agent, or Firm*—Fletcher, Yoder & Van Someren

(57) ABSTRACT

A technique for reducing acoustic noise emitted by a magnetic resonance imaging system includes providing energy dampening elements in the scanner, such as within the gradient coil assembly, between the gradient coil assembly and the primary magnet, and around the outer and inner peripheries of the primary magnet and RF coil. The elements may be formed to conform to the structures of the scanner, and may be tile-like elements which can be fitted to new scanners and retrofitted to existing equipment.

32 Claims, 4 Drawing Sheets

METHOD AND APPARATUS FOR REDUCING ACOUSTIC NOISE IN MRI SCANNERS

FIELD OF THE INVENTION

The present invention relates generally to the field of magnetic resonance imaging systems and, more particularly, to a technique for reducing acoustic noise in such systems.

BACKGROUND OF THE INVENTION

Magnetic resonance imaging (MRI) systems have become ubiquitous in the field of medical diagnostics. Over the past decades, improved techniques for MRI examinations have been developed that now permit very high quality images to be produced in a relatively short time. As a result, diagnostic images with varying degrees of resolution are available to the radiologist that can be adapted to particular diagnostic applications.

In general, MRI examinations are based on the interactions among a static or primary magnetic field, a radio frequency (RF) magnetic field and time varying magnetic field gradients, with nuclear spins within the subject of interest. Specific nuclear components, such as hydrogen nuclei in water molecules, have characteristic behaviors in response to external magnetic fields. The precession of spins of such nuclear components can be influenced by manipulation of the fields to obtain RF signals that can be detected, processed, and used to reconstruct a useful image.

The magnetic fields used to produce images in MRI systems include a highly uniform, static main magnetic field that is produced by a primary magnet. A series of gradient fields are produced by a set of three gradient coils disposed around the subject. The gradient fields encode positions of individual volume elements or voxels in three dimensions. A radio frequency coil is employed to produce an RF magnetic field. This RF magnetic field perturbs the spin system from its equilibrium. Upon returning to the equilibrium after termination of the RF field, RF signals are emitted. Such emissions are detected by either the same transmitting RF coil, or by a separate receive-only coil. These signals are amplified, filtered, and digitized. The digitized signals are then processed using one of several possible reconstruction algorithms to reconstruct a useful image.

Many specific techniques have been developed for acquiring MR images for a variety of applications. One major difference among these techniques is in the way gradient pulses and RF pulses are used to manipulate the spin systems to yield different image contrasts, signal-to-noise ratios, and resolutions. Graphically, such techniques are illustrated as "pulse sequences" in which pulses applied to the gradient and RF coils are represented along with temporal relationships among them. In recent years, pulse sequences have been developed which permit extremely rapid acquisition of large amounts of raw data. Such pulse sequences permit significant reduction in the time required to perform the examinations. Time reductions are particularly important for acquiring high resolution images, as well as for suppressing motion effects and reducing the discomfort of patients in the examination process.

While MRI systems excel in providing high quality images used in medical diagnostic applications, further improvement to the system is still needed. For example, by interaction of the pulses produced during an examination with the various mechanical and magnetic structures of the MRI scanner, acoustic noise can be produced which is transmitted both through the examination room in which the scanner is placed, as well as within the patient bore. Although the amplitudes and frequencies of the acoustic noise are not dangerous for the patient, the noise can be discomforting for patients and add to the anxiety of the examination. The noise can also be distracting and discomforting for clinicians and radiologists performing the examinations. While attempts have been made to reduce acoustic noise in MRI scanners, such as by changes in pulse sequences, further improvements are still needed. Specifically, although, as a general goal, noise at all frequencies emitted by MRI scanners should be further reduced, there is a particular need, at present, for techniques which can reduce noise in an audible range of approximately 15 Hz to approximately 15 kHz.

SUMMARY OF THE INVENTION

The present invention provides a novel technique for reducing acoustic noise emitted by an MRI scanner designed to respond to such needs. The technique makes use of energy absorbing laminate structures which can be placed in various locations in and around the scanner structure to reduce emitted acoustic noise. The technique is adaptable in many ways to provide for noise reduction both within the patient bore, within the gradient coil structures, and in and around the structures supporting the RF coil, the gradient coils, and the primary magnet. The technique may be adapted for new coils and scanners, and may also be adapted for retrofitting existing scanners, such as during regular or special servicing.

In an exemplary implementation, laminate tiles or subunits are made for fitting to the various structures in which noise dampening is desired. Laminate tiles may include a range of materials and composite structures, such as a structural support to which an energy absorbing material is applied. Multiple layers of material may be provided, where desired. The design and configuration of the individual subunits or tiles facilitates their application to the coil structures and to the housing and support structures of the scanner. The acoustic noise reducing tiles may thus be provided in a kit for retrofitting existing scanners.

DETAILED DESCRIPTION OF THE INVENTION

Figure 1:
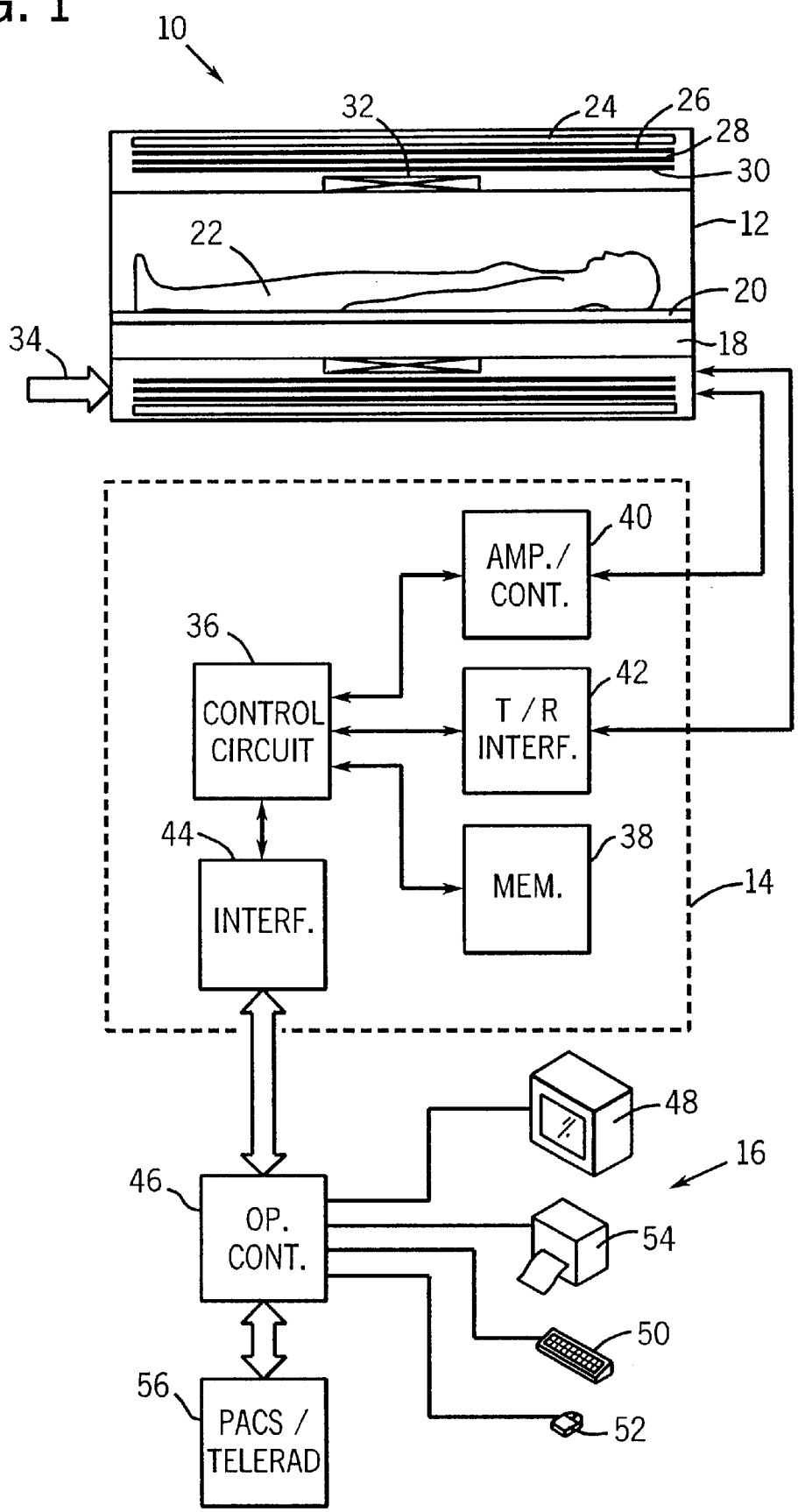
FIG. 1 is a diagrammatical representation of an MRI system for use in medical diagnostic imaging and implementing certain aspects of the present shielding technique.

Turning now to the drawings, and referring first to FIG. 1, a magnetic resonance imaging (MRI) system 10 is illustrated diagramatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radio frequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radio frequency coil 32 is provided for generating radio frequency pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for outputting radio frequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth. As discussed in greater detail below, the scanner 12 includes energy-dampening laminate structures disposed at various locations about the primary magnet coil 24, the gradient coils 26, 28 and 30, and the radio frequency coil 32 for reducing emitted acoustic noise from the scanner during use.

The coils of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field, individual magnetic moments of the paramagnetic nuclei in the tissue attempt to aligned with the field but precess in a random order at their characteristic or Larmor frequency. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. Radio signals are emitted following the termination of the excitation signals. This magnetic resonance signal is detected in the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes, as well as by logical axes. In the physical sense, the fields are mutually orthagonally oriented to form a coordinate system which can be rotated by appropriate manipulation of the pulsed current applied to the individual field coils. In a logical sense, the coordinate system defines gradients which are typically referred to as slice select gradients, frequency encoding gradients, and phase encoding gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radio frequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radio frequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a cylindrical bore imaging system employing a superconducting primary field magnet assembly, the present technique may be applied to various other configurations, such as scanners employing vertical fields with permanent magnets and electromagnets.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
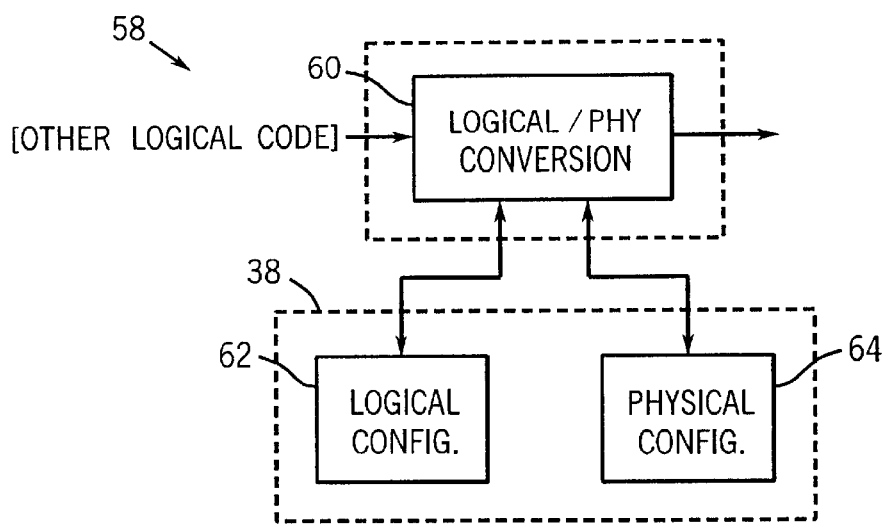
FIG. 2 is a block diagram of functional components of an exemplary pulse sequence description module in a controller for a system of the type illustrated in FIG. 1.

In general, these pulse sequences implemented in the MRI system will be defined by both logical and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both logical and physical axes of the system. In general, the axis control modules, denoted collectively by reference numeral 58, include a logical-to-physical module 60 which is typically implemented via software routines executed by control circuit 36. In particular, the conversion module is implemented through control routines which define particular pulse sequences in accordance with preestablished imaging protocols.

When called upon, code defining the conversion module references logical configuration sets 62 and physical configuration sets 64. The logical configuration sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
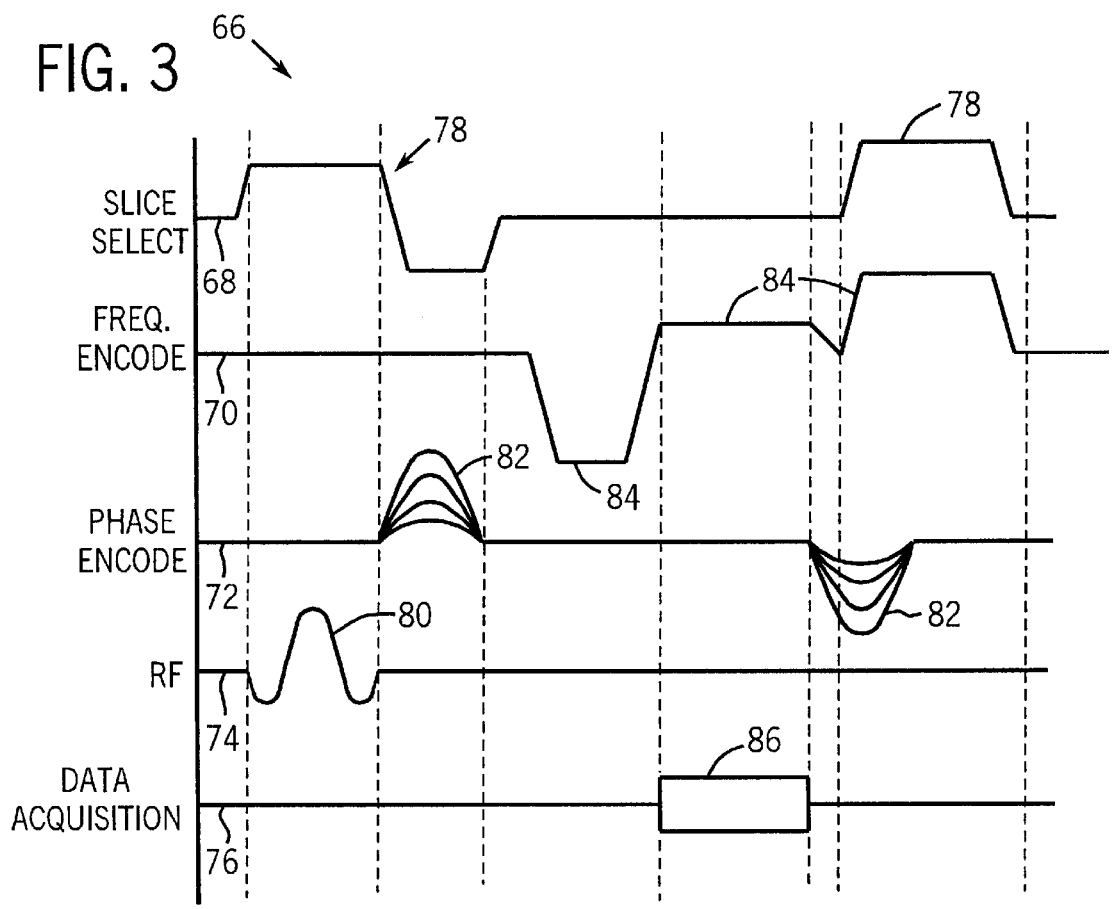
FIG. 3 is a graphical representation of an exemplary pulse sequence description for an MRI examination which may be implemented in the system of FIG. 1.

By way of example, FIG. 3 illustrates a typical pulse sequence which may be implemented on a system such as that illustrated in FIG. 1 and calling upon configuration and conversion components such as those shown in FIG. 2. While many different pulse sequence definitions may be implemented, depending upon the examination type, in the example of FIG. 3, a gradient recalled acquisition in steady state mode (GRASS) pulse sequence is defined by a series of pulses and gradients appropriately timed with respect to one another. The pulse sequence, indicated generally by reference numeral 66, is thus defined by pulses on a logical slice select axis 68, a frequency encoding axis 70, a phase encoding axis 72, an RF axis 74, and a data acquisition axis 76. In general, the pulse sequence description begins with a pair of gradient pulses on slice select axis 68 as represented at reference numeral 78. During a first of these gradient pulses, an RF pulse 80 is generated to excite gyromagnetic material in the subject. Phase encoding pulses 82 are then generated, followed by a frequency encoding gradient 84. A data acquisition window 86 provides for sensing signals resulting from the excitation pulses which are phase and frequency encoded. The pulse sequence description terminates with additional gradient pulses on the slice select, frequency encoding, and phase encoding axes.

Depending upon the orientation of the desired slice, and the strength of the fields desired, the logical configuration parameters of pulse sequence 66 may vary to provide faster or slower onset of the gradients, greater or lesser gradient amplitudes, various timings between the gradients, and so forth. Moreover, these logical configurations will be limited by physical configurations of the scanner and associated electronics.

As will appreciated by those familiar with MRI systems, acoustic noise can be generated at various phases of the examination pulse sequence due to a range of factors. While the specific factors and patterns of noise may be quite complex, in general, they are believed to result from interactions between the pulsed magnetic fields, the primary magnetic field, and the coil and support structures comprising the scanner. In practice, a patient and clinicians may experience a range of noises varying in frequency and amplitude throughout various phases of an examination. In accordance with the present technique, energy absorbing or dampening laminate structures are provided at locations within the scanner to attenuate the acoustic noise transmitted both within the patient bore and outside the scanner.

Figure 4:
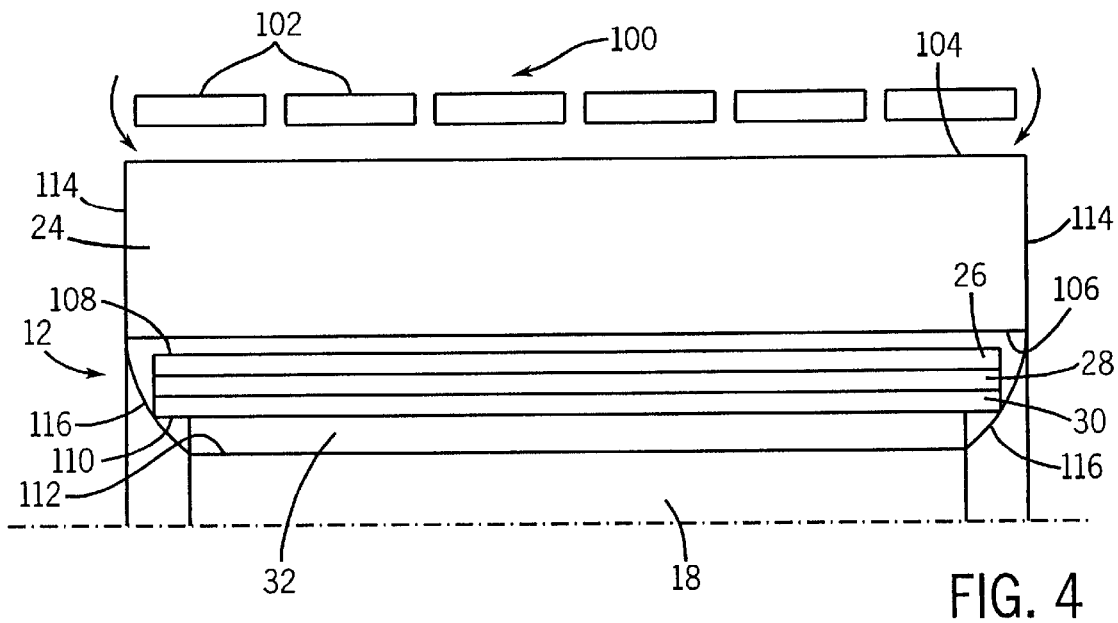
FIG. 4 is a diagrammatical representation of one side of an MRI scanner indicating specific locations at which acoustic noise-dampening laminate structures may be placed in accordance with aspects of the present technique for reducing emitted acoustic noise.

FIG. 4 illustrates, somewhat diagrammatically, a portion of a full body scanner and indicates locations within the scanner structure in which the noise-dampening laminates may be provided. Specifically, the scanner 12, as described above, includes a primary magnet 24 and a series of gradient coils 26, 28 and 30 making up the gradient coil assembly. Within the gradient coil assembly, the RF coil 32 is positioned for generating the RF magnetic field and for receiving emissions during an examination sequence. In accordance with the present technique, noise-dampening structures 100 are placed at various locations within the scanner to dampen and absorb acoustic energy or energy which can lead to the production of acoustic noise during an examination.

In the exemplary embodiment of FIG. 4, the noise-dampening structures 100 include a series of tile-like elements 102 which are applied to the desired locations within the scanner. In the illustrated embodiment, tiles 102 are applied to the outer diameter 104 of the primary magnet 24, as well as to the inner diameter 106 of the primary magnet. Similarly, additional tiles are applied to the outer diameter 108 of the gradient coil assembly, and to the inner diameter 110 of the gradient coil assembly. Further tiles are applied to the outer diameter 112 of the RF coil 32 and/or of the patent bore. In the case of a whole body scanner as illustrated in FIG. 4, additional tiles may be applied to the main magnet flanges at locations 114, and to afore and aft end bells 1 16 on either end of the gradient coil assembly. The tiles are secured in their respective locations either by sandwiching the tiles physically between the individual elements, by adhesive attachment or by any other suitable means. It should also be noted that the spacing and distribution of the tiles may be adapted for the specific application, and will vary somewhat depending upon the anticipated energy levels of the scanner at various frequencies, the size of the scanner components, and so forth. Moreover, it should be noted that the noise-dampening structures may be provided at fewer, more or different locations than those indicated in the exemplary embodiment of FIG. 4. In use, energy in a variety of frequency bands, particularly those between approximately 15 Hz and 15 kHz, corresponding generally to the audible range of frequencies is absorbed and dampened by the laminate structures to reduce the acoustic noise transmitted both within the patient bore and outside the scanner.

Figure 5:
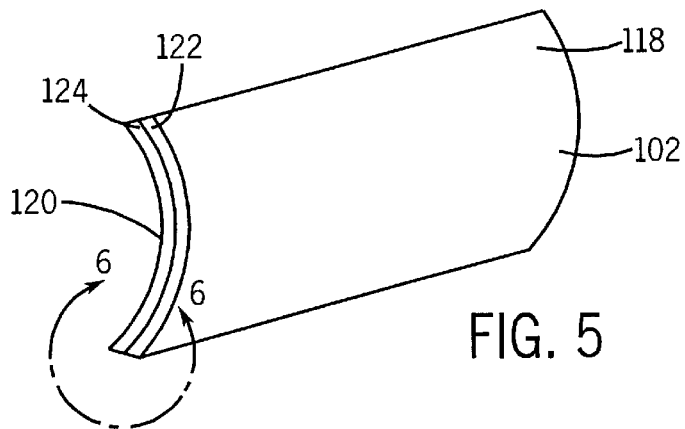
FIG. 5 is a prospective view of an exemplary laminate tile of the type which may be applied at locations indicated in FIG. 4.

FIG. 5 illustrates an exemplary laminate structure in the form of a tile-like element 102. In the embodiment of FIG. 5, the laminate structure comprises two layers of material bent in an arcuate configuration to be applied to an outer or an inner peripheral surface of a magnet or coils structure. In the illustrated embodiment, the element 102 thus forms an outer wall 118 and an inner wall 120 which may be secured to the support element. The laminate structure comprises an outer layer 122 and an inner layer 124 which are adapted for absorbing and dissipating energy within the desired frequency range.

Figure 6:
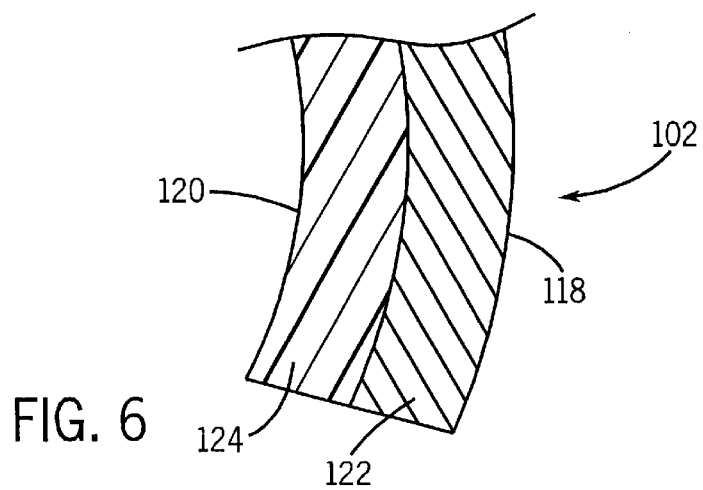
FIG. 6 is a detailed view of a two-layered laminate structure of the type shown in FIG. 5.

A somewhat more detailed representation of a section of the element of FIG. 5 is represented in FIG. 6. In the embodiment of FIG. 6, the inner layer 124 comprises a visco-elastic material. The outer layer 122 which constrains the inner layer comprises a rigid support, such as stainless steel or fiber glass. In the presently preferred embodiments, a non-conductive constraining layer is used in areas, such as on the gradient coil inner diameter or adjacent to the RF coil to avoid creation of eddy currents due to the changing magnetic fields during examinations. Constraining materials such as stainless steel may be used whereas such eddy currents are not an issue, such as on the gradient coil outer diameter, near the primary magnet, and on the enclosure well beyond the imaging volume. By way of example, dissipated materials suitable for use in the laminate structure may be obtained from a variety of sources such as Minnesota Mining and Manufacturing Co. (3M) under the designation ISD.

It should be noted that various adaptations may be made in the specific structure of the noise-dampening elements for use in MRI applications. For example, while a two-layer structure is disclosed herein, multi-layer structures, including multiple layers of rigid or semi-rigid materials and layers of more resilient materials may be employed. Similarly, the support structures in the laminates may be provided on inner or outer surfaces of the elements, or on both surfaces. Conversely, the surfaces may comprise resilient materials, with underlying structure materials to maintain form, shape, and contour. Finally, the elements may be formed or shaped in various manners to conform more closely to the surfaces of the scanner to which they are to be applied.

The present technique is applicable for both new equipment and for retrofitting existing equipment. Specifically, for new scanner designs, spaces or regions may be provided in the areas where the noise-dampening structures are to be mounted to permit their insertion and securement. The contours of the various structures may be adapted to receive laminates, such as the tile structures described above. In retrofit applications, where space permits, tile or other laminate configurations may be provided which can either be pre-shaped to fit the specific component, or which may be bent or contoured during installation. Thus, the present technique also contemplates a kit-type assembly in which a series of pieces or laminates, which again, may be pre-formed or formed during installation, are supplied for reducing acoustic noise in existing equipment.

Figure 7:
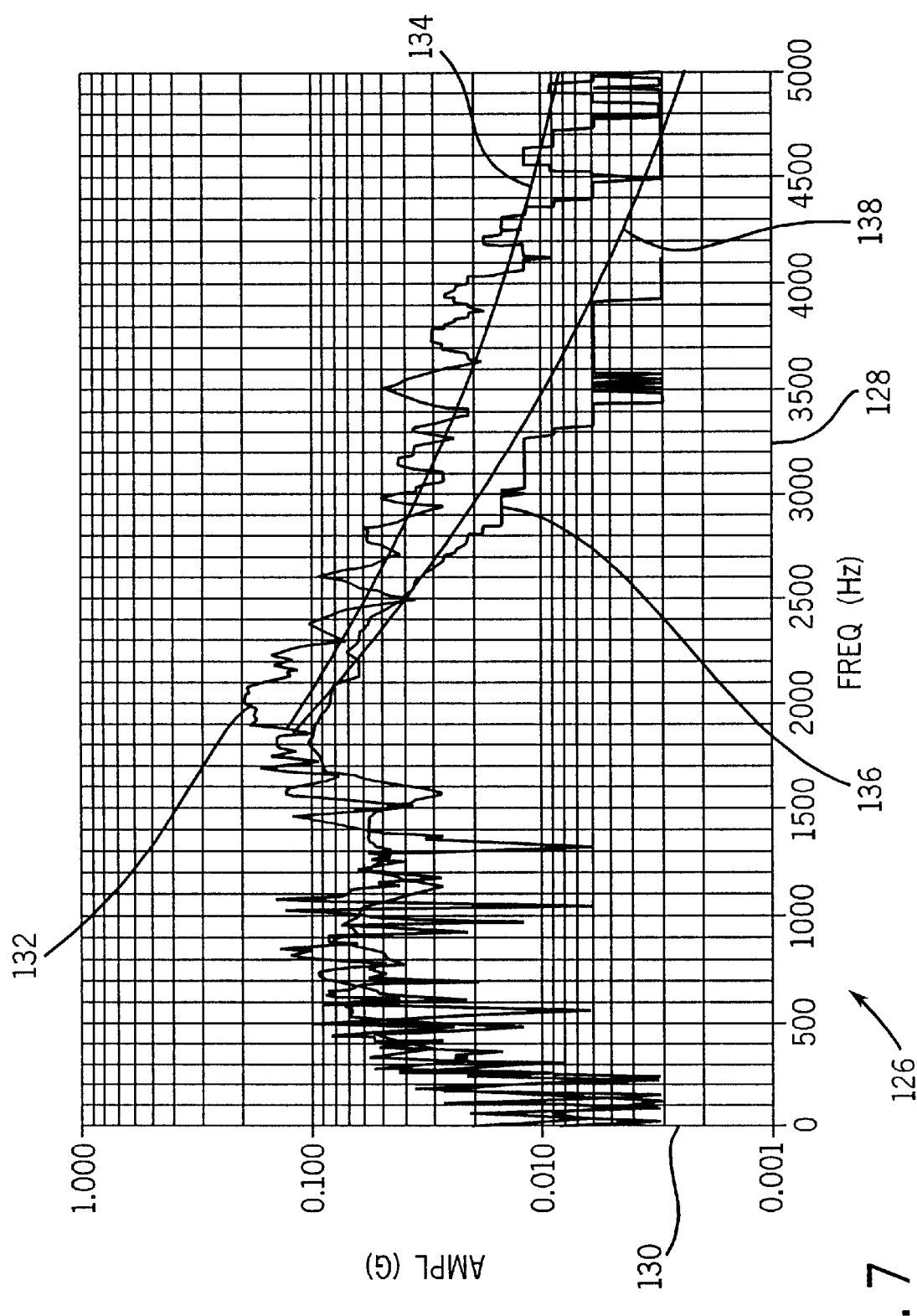
FIG. 7 is a graphical representation of acoustic noise levels, illustrating the reduction in acoustic noise emitted by placement of energy-dampening laminates in accordance with aspects of the present technique.

The foregoing noise reduction technique has demonstrated excellent results within frequency bands that include the human audible frequency band of approximately 15 Hz to approximately 15 kHz. FIG. 7 illustrates a logarithmic plot radial response in the region of an RF tube of an MRI system of the type described above both with and without noise-dampening elements. In the graphical representation 126 of FIG. 7, a horizontal axis 128 represents frequency in Hz, while a vertical axis 130 represents amplitude. A raw data trace 132 represents amplitudes of noise at various frequencies along the response plot, with a smooth curve 134 being fitted between frequencies of approximately 1.8 kHz and 5 kHz. Similarly, the raw data tract 136 represents amplitudes of noise at the in the same frequency range, with a smooth curve 138 being fitted between the upper frequency sub-band. As both the raw data and the fitted curves indicate, the use of energy absorbing and noise dampening structures in the scanner substantially reduced the noise emitted by the scanner within the indicated sub-band, within the human audible range.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A magnetic resonance imaging scanner comprising:
   a primary magnet;
   a gradient coil set including first, second and third gradient coils at least partially surrounded by the primary magnet;
   a radio frequency coil at least partially surrounded by the gradient coil set; and
   a set of acoustic noise dampening elements disposed in the scanner for dissipating acoustic noise during operation of the scanner, wherein the acoustic noise dampening elements are tile elements including a constraining layer and an energy absorbing material on the constraining layer.

2. The scanner of claim 1, wherein the acoustic noise dampening elements are disposed around an outer surface of the primary magnet.

3. The scanner of claim 1, wherein the acoustic noise dampening elements are disposed around an inner surface of the primary magnet.

4. The scanner of claim 1, wherein the acoustic noise dampening elements are disposed around an outer surface of the gradient coil set.

5. The scanner of claim 1, wherein the acoustic noise dampening elements are disposed around an inner surface of the gradient coil set.

6. The scanner of claim 1, wherein the acoustic noise dampening elements are disposed around an end of the primary magnet.

7. The scanner of claim 1, wherein the acoustic noise dampening elements are disposed around an end of the gradient coil set.

8. The scanner of claim 1, wherein the acoustic noise dampening elements are disposed around an outer surface of the radio frequency coil.

9. The scanner of claim 1, wherein the acoustic noise dampening elements include a first layer of constraining material and a second layer of visco-elastic material.

10. The scanner of claim 1, wherein the constraining material includes stainless steel.

11. The scanner of claim 1, wherein the constraining material includes a non-conductive material.

12. The scanner of claim 11, wherein the constraining material includes fiberglass.

13. A magnetic resonance imaging system comprising:
    a scanner having a primary magnet, a gradient coil set including first, second and third gradient coils at least partially surrounded by the primary magnet, a radio frequency coil at least partially surrounded by the gradient coil set;
    control circuitry coupled to the scanner for applying controlled pulsed signals to the gradient and radio frequency coils during imaging sequences; and
    a set of acoustic noise dampening elements disposed in the scanner for dissipating acoustic noise generated by the scanner during the imaging sequences, wherein the noise dampening elements include multilayer laminate structures including a constraining layer and an energy dampening layer; and
    wherein the noise dampening elements are tile-like elements secured to a supporting structure of the scanner.

14. The system of claim 13, wherein the scanner is a whole scanner including a patient bore, and wherein the noise dampening elements are disposed to reduce noise at least in a patient bore.

15. The system of claim 14, wherein the noise dampening elements are disposed in the scanner for dissipating acoustic noise outside the patient bore.

16. The system of claim 13, wherein the noise dampening elements are disposed at least along an inner surface of the gradient coil set.

17. The system of claim 16, wherein the noise dampening elements are also disposed along an outer surface of the radio frequency coil.

18. The system of claim 16, wherein the noise dampening elements are also disposed along an outer surface of the gradient coil set.

19. The system of claim 13, wherein the support layer is non-conductive.

20. The system of claim 13, wherein the energy dampening layer is a visco-elastic layer.

21. The system of claim 13, wherein the noise dampening elements are contoured to conform to a structure of the scanner to which the elements are mounted.

22. A method for attenuating noise in a magnetic resonance imaging system, the system including a scanner having a primary magnet, a gradient coil set including first, second and third gradient coils at least partially surrounded by the primary magnet, a radio frequency coil at least partially surrounded by the gradient coil set, the system further including control circuitry coupled to the scanner for applying controlled pulsed signals to the gradient and radio frequency coils during imaging sequences, the method including the step of:
    disposing acoustic noise dampening elements within the scanner to reduce acoustic noise emitted by the scanner during the imaging sequences at least towards a patient support volume, wherein the acoustic noise dampening elements are tile-like elements applied to a support structure of the scanner.

23. The method of claim 22, wherein the acoustic noise dampening elements include a constraining layer and an energy dampening layer.

24. The method of claim 22, wherein the elements are disposed on a supporting component of the scanner such that the constraining layer is external to the supporting component.

25. The method of claim 22, wherein the elements are disposed on a supporting component of the scanner such that the energy dampening layer is adjacent to the supporting component.

26. The method of claim 22, wherein the acoustic noise dampening elements are disposed at least around an inner surface of the gradient coil set.

27. The method of claim 22, wherein the acoustic noise dampening elements are disposed in at least two different locations between the radio frequency coil and the outer surface of the primary magnet.

28. The method of claim 22, comprising the further step of conforming the acoustic noise dampening elements to an element of the scanner.

29. A kit for reducing acoustic noise from an MRI scanner, the kit comprising a plurality of acoustic noise dampening elements configured to be disposed to surfaces of the scanner and to dissipate acoustic energy generated during application of controlled pulses to the scanner during an imaging sequence, wherein the elements are tile-like elements configured for placement around inner or outer surfaces of either a primary magnet, a gradient coil set and a radio frequency coil.

30. The kit of claim 29, wherein the elements are preformed to conform to a supporting surface to which the elements are applied in the scanner.

31. The kit of claim 29, wherein the elements include a constraining layer and an energy dampening layer supported on the support layer.

32. The kit of claim 29, wherein the elements are configured to be adhesively applied to a scanner component.

* * * * *